United States Patent
Hong et al.

(10) Patent No.: US 9,732,419 B2
(45) Date of Patent: Aug. 15, 2017

(54) APPARATUS FOR FORMING GAS BLOCKING LAYER AND METHOD THEREOF

(71) Applicant: Korea University Research and Business Foundation, Seoul (KR)

(72) Inventors: MunPyo Hong, Seoul (KR); You Jong Lee, Seoul (KR); Yun-Sung Jang, Chungcheongnam-do (KR); Jun Young Lee, Seoul (KR)

(73) Assignee: KOREA UNIVERSITY RESEARCH AND BUSINESS FOUNDATION, Seoul (KR)

(*) Notice: Subject to any disclaimer, the term of this patent is extended or adjusted under 35 U.S.C. 154(b) by 693 days.

(21) Appl. No.: 13/769,108

(22) Filed: Feb. 15, 2013

(65) Prior Publication Data

US 2013/0161184 A1 Jun. 27, 2013

Related U.S. Application Data

(63) Continuation of application No. PCT/KR2011/005937, filed on Aug. 12, 2011.

(30) Foreign Application Priority Data

Aug. 16, 2010 (KR) .................. 10-2010-0078762

(51) Int. Cl.
C23C 14/35 (2006.01)
H01J 37/34 (2006.01)
(Continued)

(52) U.S. Cl.
CPC ............... C23C 16/44 (2013.01); B05D 1/62 (2013.01); C23C 14/086 (2013.01); C23C 14/22 (2013.01);
(Continued)

(58) Field of Classification Search
CPC ......... B05D 1/62; C23C 14/086; C23C 14/22; C23C 14/225; C23C 14/3464;
(Continued)

(56) References Cited

U.S. PATENT DOCUMENTS 3,897,325 A * 7/1975 Aoshima ............. H01J 37/3402
204/192.12
4,599,135 A * 7/1986 Tsunekawa ........... C23C 16/452
118/50.1
(Continued)

FOREIGN PATENT DOCUMENTS

EP 2 180 762 A1 4/2010
EP 2 184 727 A1 5/2010
(Continued)

OTHER PUBLICATIONS

Jang et al. "Oxygen elimination effect in silicon thin film by neutral beam assisted CVD system at room temperature", Photovoltaic Specialists Conference (PVSC), Jun. 2010, 35th IEEE.*
(Continued)

*Primary Examiner* — Rodney McDonald
(74) *Attorney, Agent, or Firm* — McDermott Will & Emery LLP

(57) ABSTRACT

A gas blocking layer forming apparatus comprises a vacuum chamber that provides a space where a chemical vapor deposition process and a sputtering process are performed; a holding unit that is provided at a lower side within the vacuum chamber and mounts thereon a target object on which an organic/inorganic mixed multilayer gas blocking layer is formed; a neutral particle generation unit that is provided at an upper side within the vacuum chamber and generates a neutral particle beam having a high-density flux with a current density of about 10 A/m² or more; and common sputtering devices that are provided at both sides of the neutral particle generation unit, wherein each common
(Continued)

sputtering device has a sputtering target of which a surface is inclined toward a surface of the target object.

12 Claims, 8 Drawing Sheets

(51) Int. Cl.
| | |
|---|---|
| C23C 16/44 | (2006.01) |
| C23C 16/22 | (2006.01) |
| C23C 14/22 | (2006.01) |
| C23C 14/34 | (2006.01) |
| B05D 1/00 | (2006.01) |
| C23C 14/08 | (2006.01) |
| C23C 16/00 | (2006.01) |
| H01J 37/32 | (2006.01) |
| H01L 51/52 | (2006.01) |

(52) U.S. Cl.
CPC ........ *C23C 14/225* (2013.01); *C23C 14/3464* (2013.01); *C23C 14/35* (2013.01); *C23C 16/00* (2013.01); *C23C 16/22* (2013.01); *H01J 37/32357* (2013.01); *H01J 37/32422* (2013.01); *H01J 37/347* (2013.01); *H01J 37/3417* (2013.01); *H01L 51/5256* (2013.01); *H01J 2237/332* (2013.01)

(58) Field of Classification Search
CPC ......... C23C 16/00; C23C 16/22; C23C 16/44; H01J 37/32357; H01J 37/32422; H01J 37/3417; H01J 37/347; H01J 2237/332; H01L 51/5256
USPC ............ 204/192.12, 298.06, 298.11, 298.14, 204/298.16, 298.26
See application file for complete search history.

(56) References Cited

U.S. PATENT DOCUMENTS

| | | | | |
|---|---|---|---|---|
| 2004/0106285 | A1* | 6/2004 | Zacharias | C23C 14/06 438/689 |
| 2004/0195960 | A1* | 10/2004 | Czeremuszkin | C08J 7/045 313/504 |
| 2005/0034979 | A1* | 2/2005 | Druz | C23C 14/221 204/298.02 |
| 2007/0057625 | A1* | 3/2007 | Kim | C23C 14/35 313/503 |
| 2010/0078309 | A1* | 4/2010 | Ueda | C23C 14/352 204/192.1 |

FOREIGN PATENT DOCUMENTS

| | | | |
|---|---|---|---|
| JP | 09-036040 | | 2/1997 |
| JP | 09-036040 | | 7/1997 |
| JP | 2001-081553 | * | 3/2001 |
| JP | 2005-528250 A | | 9/2005 |
| JP | 2008-538592 A | | 10/2008 |
| KR | 102004027940 A | | 4/2004 |
| KR | 102004010479 A | | 12/2004 |
| KR | 1020050031659 A | | 4/2005 |
| KR | 10-2006-0118084 A | | 11/2006 |
| KR | 1020060118084 A | | 11/2006 |
| WO | 2008/002046 A1 | | 1/2008 |
| WO | 2009009306 A2 | | 1/2009 |

OTHER PUBLICATIONS

Japanese Office Action issued in Japanese Application No. 2013-524783 dated Mar. 3, 2014, w/English translation.
International Search Report of PCT/KR2011/005937 dated Mar. 6, 2012.
Office Action for KR Application No. 10-2010-0078762 and an English translation thereof.
Extended European Search Report issued in corresponding European Patent Application No. 11818360.7, mailed on Jul. 22, 2015.

* cited by examiner

APPARATUS FOR FORMING GAS BLOCKING LAYER AND METHOD THEREOF

This application is a continuation of international application PCT/KR2011/005937 filed Aug. 12, 2011, which claims priority on Korean Patent Application No. 10-2010-0078762 filed Aug. 16, 2010, the entire contents of each of which is hereby incorporated by reference.

TECHNICAL FIELD

The present invention relates to an apparatus for forming a gas blocking layer for blocking moisture and an oxygen gas which is used for an organic electronic device such as an organic light emitting device, an organic solar cell, and the like, and a method thereof, and more particularly to an apparatus for forming a gas blocking layer and a method thereof which can form a high-performance gas blocking layer for satisfying characteristics of improved productivity and lower manufacturing costs by forming all the gas blocking layers within a vacuum chamber for process to maintain continuity. A process for forming an organic/inorganic mixed multilayer gas blocking layer of a stacked structure including an organic thin film and an inorganic thin film to form the high-performance gas blocking layer comprises forming a high-density thin film through a continuous change in a size of a nano-crystal structure according to a thickness of the single inorganic thin film being variably controlled by using a neutral particle beam processing method based on sputtering methods for forming the inorganic thin film thereof and forming the organic thin film to selectively have a buffering substrate layer formed by a Chemical Vapor Deposition (CVD) method for vaporizing liquefied materials for organic polymer thin films.

BACKGROUND ART

Generally, an organic electronic device such as an organic light emitting device and an organic solar cell are very vulnerable to moisture and oxygen due to organic materials used therefor. In order to solve this problem, there have been developed various sealing techniques for suppressing infiltration of moisture and oxygen into an organic electronic device.

In the most common sealing technique used today, glass substrates are used. An upper glass substrate to which a moisture absorbent adheres is bonded to a lower substrate on which an organic electronic device is formed so as to block moisture and oxygen.

However, a sealing technique using glass substrates has been regarded as inappropriate for a next-generation organic electronic device since it uses expensive glass substrates and is not applicable to a large-sized substrate and flexibility required for a flexible organic electronic device cannot be obtained. In order to solve this problem, various thin film type sealing techniques have been developed actively.

A thin film type sealing technique can be wieldy applied to a method in which a sealing thin film for blocking gas is directly formed on a lower substrate on which an organic light emitting device, an organic solar cell, and the like are formed and a method in which a sealing thin film for blocking gas is formed on a polymer film and bonded thereto through lamination. Recently, the method for forming a laminated film-based gas blocking layer has been preferred since it is easier to obtain productivity and easily applicable to various organic electronic devices as compared with the method for forming a gas blocking layer directly on an organic electronic device.

In order to commercialize the thin film type sealing technique, a performance of a gas blocking layer for blocking moisture and an oxygen gas fundamentally needs to be obtained. Recently, a multilayered thin film-structured gas blocking layer formed by stacking two or more kinds of single gas blocking layers has been mainly studied and developed. Theoretically, if a single inorganic thin film made of $Al_2O_3$, $SiO_2$ or SiNx can be formed in a high-density thin film without defects in process and defects within the thin film, the single inorganic thin film as a gas blocking layer for blocking moisture and an oxygen gas can be sufficient to obtain such a performance. However, is impossible to form a zero-defect thin film without cracks, pinholes, and the like by a typical inorganic thin film deposition method such as a sputtering method and a chemical vapor deposition method. Further, it is impossible to solve a problem of an infiltration path of moisture and an oxygen gas caused by a defect which may occur in a thin film to be formed depending on roughness of a substrate and a void formed at a boundary between crystals as a result of crystallization of the thin film with conventional inorganic thin film forming methods.

As a solution to this problem, an organic/inorganic mixed multilayer gas blocking layer of a stacked structure including an organic thin film and an inorganic thin film to form a high-performance gas blocking layer has been studied and developed actively.

The organic/inorganic mixed multilayer gas blocking layer is capable of greatly reducing moisture permeability by extending an infiltration path of moisture and an oxygen gas even if there is a defect at a certain level or less within the inorganic thin film and is very advantageous to obtain flexibility required for a flexible organic electronic device. Therefore, it has been regarded as appropriate for commercialization of a next-generation organic electronic device.

As a representative technique for forming an organic/inorganic mixed multilayer gas blocking layer, there is a gas blocking layer produced by Vitex Systems, Inc. (US). This gas blocking layer has been regarded as a unique technique capable of ensuring a long life of a next-generation high-performance organic electronic device such as a high-efficiency organic light emitting device among thin film type sealing techniques currently available.

However, if defects of an inorganic thin film cannot be fundamentally solved, a conventional organic/inorganic mixed multilayer gas blocking layer needs five or more stacked films to suppress infiltration of moisture and oxygen. Further, an atmospheric coating process and a vacuum deposition process need to be performed alternately for forming each of a buffering organic thin film and an inorganic gas blocking layer, and, thus, productivity can be decreased and manufacturing costs can be increased.

In particular, a gas blocking organic/inorganic thin film formed by a conventional vacuum deposition process and an atmospheric coating process is not sufficient to suppress infiltration of moisture and oxygen. Therefore, it needs to have organic/inorganic multilayer thin films stacked at least five or more times so as to be applied to a high-performance organic light emitting device. Thus, overall manufacturing costs of a blocking layer can be further increased and productivity can be further decreased.

Recently, in order to reduce the number of stacked organic/inorganic multilayer thin films, methods for forming a high-performance gas blocking layer using various deposition methods and various deposition materials have been studied actively. As a result of some studies using an Atomic Layer Deposition (ALD) method, formation of a high-performance gas blocking layer has been reported. However, the ALD method cannot be used as a commercialized technique in view of productivity and low manufacturing costs. According to some studies of forming a gas blocking layer based on a sputtering method and a CVD method, requirements in view of productivity and lower manufacturing costs can be easily satisfied but a gas blocking layer cannot be expected to be commercialized in view of performance.

DISCLOSURE OF THE INVENTION

Problems to be Solved by the Invention

In view of the foregoing, the present invention provides an apparatus for forming a gas blocking layer and a method thereof which can form a high-performance gas blocking layer for satisfying characteristics of improved productivity and lower manufacturing costs by forming all the gas blocking layers within a vacuum chamber for process to maintain continuity. A process for forming an organic/inorganic mixed multilayer gas blocking layer of a stacked structure including an organic thin film and an inorganic thin film to form the high-performance gas blocking layer comprises forming a high-density thin film through a continuous change in a size and a density of a nano-crystal structure according to a thickness of the single inorganic thin film being variably controlled by using a neutral particle beam processing method based on sputtering methods for forming the inorganic thin film thereof and forming the organic thin film to selectively have a buffering substrate layer formed by a CVD method for vaporizing liquefied materials for organic polymer thin films.

Means for Solving the Problems

In accordance with an illustrative embodiment of the present invention, there is provided a gas blocking layer forming apparatus. The apparatus may include a vacuum chamber that provides a space where a chemical vapor deposition process and a sputtering process are performed; a holding unit that is provided at a lower side within the vacuum chamber and mounts thereon a target object on which an organic/inorganic mixed multilayer gas blocking layer is formed; a neutral particle generation unit that is provided at an upper side within the vacuum chamber and generates a neutral particle beam having a high-density flux with a current density of about 10 $A/m^2$ or more; and common sputtering devices that are provided at both sides of the neutral particle generation unit. Each common sputtering device has a sputtering target of which a surface is inclined toward a surface of the target object.

Further, the apparatus may include a plasma limiter that is provided among the holding unit, the neutral particle generation unit, and the common sputtering unit. The plasma limiter generates a magnetic field in a horizontal direction in order for negative ions not to move toward the target object by confining electrons in plasma.

Herein, the plasma limiter may include a magnet array that includes magnet pairs each comprised of a N-pole magnet and a S-pole magnet bonded to each other; and a fixed frame that fixes the magnet array and is fixed to an inside of the vacuum chamber. The magnet pairs are spaced from each other so as to form a slit.

Furthermore, the holding unit may be configured to make a reciprocating movement within the vacuum chamber.

Herein, a direction of the reciprocating movement of the holding unit may be perpendicular to a longitudinal axis of the slit.

Herein, the holding unit may include a temperature control unit that heats and cools the target object.

Moreover, the target object may include a plastic substrate or a substrate on which a functional coating film is formed.

Further, the target object may include a substrate on which an organic light emitting device or an organic solar cell is formed.

In accordance with an illustrative embodiment of the present invention, there is provided a gas blocking layer forming method. The method may include forming an organic/inorganic thin film by forming an inorganic thin film on a target object within a vacuum chamber and an organic thin film thereon or by forming an organic thin film and an inorganic thin film thereon; and forming an organic/inorganic mixed multilayer thin film by repeatedly performing the step of forming the organic/inorganic thin film.

Herein, the organic thin film may be formed by a chemical vapor deposition process.

Herein, the organic thin film may be formed by using plasma after a liquid polymer material is vaporized into a gas and supplied to the vacuum chamber or by using a neutral particle beam after a liquid polymer material is vaporized into a gas and supplied to the vacuum chamber or by heating or cooling the target object after a liquid polymer material is vaporized into a gas and supplied to the vacuum chamber.

Further, the inorganic thin film may be formed by a chemical vapor deposition process and a neutral particle beam process.

Herein, the inorganic thin film may be formed by stacking nano-crystal structured layers having different crystal sizes and densities.

Furthermore, the nano-crystal structured layers may be formed through a first process for forming a thin film having a nanoscale thickness by a sputtering method, a second process for performing a neutral particle beam process to the thin film, and a third process for repeatedly performing the first process and the second process.

Moreover, after the third process, the first process may be further performed to obtain a target thickness of the inorganic thin film.

Further, the nano-crystal structured layers may be formed by performing the neutral particle beam process and, at the same time, forming the inorganic thin film by the sputtering method.

Effect of the Invention

In accordance with the illustrative embodiments of the present invention, there are provided an apparatus for forming a gas blocking layer and a method thereof which can form a high-performance gas blocking layer for satisfying characteristics of improved productivity and lower manufacturing costs by forming all the gas blocking layers within a vacuum chamber for process to maintain continuity. A process for forming an organic/inorganic mixed multilayer gas blocking layer of a stacked structure including an organic thin film and an inorganic thin film to form the high-performance gas blocking layer comprises forming a high-density thin film through a continuous change in a size and a density of a nano-crystal structure according to a thickness of the single inorganic thin film being variably controlled by using a neutral particle beam processing method based on sputtering methods for forming the inorganic thin film thereof and forming the organic thin film to selectively have a buffering substrate layer formed by a CVD method for vaporizing liquefied materials for organic polymer thin films.

BEST MODE FOR CARRYING OUT THE INVENTION

Hereinafter, illustrative embodiments of an apparatus and a method for forming a gas blocking layer will be described in detail with reference to the accompanying drawings.

Figure 1:
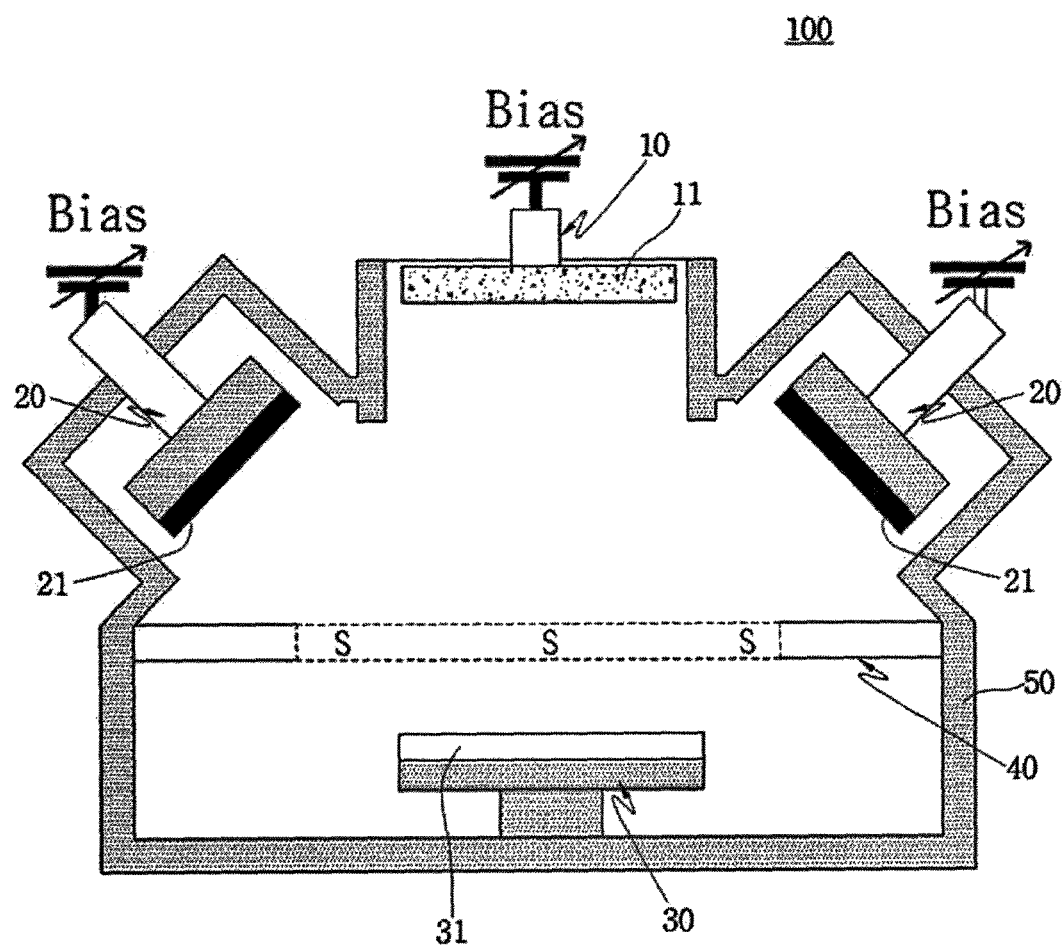
FIG. 1 is a schematic configuration view of an organic/inorganic mixed multilayer gas blocking layer in accordance with an illustrative embodiment of the present invention.

FIG. 1 is an overall configuration view of a gas blocking layer forming apparatus 100 in accordance with an illustrative embodiment. As depicted in FIG. 1, the gas blocking layer forming apparatus 100 in accordance with the illustrative embodiment of the present invention includes a vacuum chamber 50 in which a process is performed, a holding unit 30 that mounts a target object 31 on which an organic/inorganic mixed multilayer gas blocking layer is formed, a neutral particle generation unit 10 that generates a neutral particle beam, and a common sputtering unit 20.

As depicted in FIG. 1, the gas blocking layer forming apparatus 100 in accordance with the illustrative embodiment of the present invention may selectively include a plasma limiter 40 provided among the holding unit 30, the neutral particle generation unit 10, and the common sputtering unit 20.

The vacuum chamber 50 provides a space where a chemical vapor deposition process and a sputtering process are performed. That is, the chemical vapor deposition process is performed together with the sputtering process within the vacuum chamber 50. To be specific, within the vacuum chamber 50, the chemical vapor deposition process for forming an organic thin film on the target object 31 is performed together with the sputtering process for forming an inorganic thin film on the target object 31.

At a lower side within the vacuum chamber 50, the holding unit 30 is provided. The holding unit 30 provided at the lower side within the vacuum chamber 50 mounts thereon the target object 31 on which an organic/inorganic mixed multilayer gas blocking layer is formed in accordance with the present invention. Although described later, the holding unit 30 is provided so as to make a reciprocating movement within the vacuum chamber 50. The holding unit 30 may move in any direction with uniformity of a thin film. If the plasma limiter 40 is provided selectively, the holding unit 30 may be provided so as to make a reciprocating movement in a direction perpendicular to a longitudinal axis of slits of the plasma limiter 40.

As depicted in FIG. 1, the holding unit 30 is provided at the lower side with the vacuum chamber 40 and the neutral particle generation unit 10 is provided at an upper side within the vacuum chamber 40. The neutral particle generation unit 10 provided at an upper side within the vacuum chamber 40 generates a neutral particle beam while an inorganic thin film is formed on the target object 31.

As depicted in FIG. 1, the neutral particle generation unit 10 includes a conductive reflector 11 for generating a neutral particle beam and also includes a plasma source (not illustrated) for generating a neutral particle beam.

The conductive reflector 11 is provided to face the target object 31. A negative DC voltage, a negative AC voltage, a negative pulse voltage or combinations thereof may be applied to the conductive reflector 11, so that plasma ions may be vertically introduced into the conductive reflector 11. In this case, a current density of about 10 A/m$^2$ or more is applied to the conductive reflector 11, so that about 30% or more of an ion flux (Flux=nv, n: plasma density, v: velocity of an ion introduced into the reflector) introduced into the conductive reflector 11 can be converted into neutral particles. With this configuration, the neutral particle generation unit 10 can generate a high-density neutral particle beam flux with a current density of about 10 A/m$^2$ or more.

At the upper side within the vacuum chamber 50, the common sputtering unit 20 is provided in addition to the neutral particle generation unit 10. To be specific, as depicted in FIG. 1, the common sputtering unit 20 is provided at both sides of the neutral particle generation unit 10.

The common sputtering unit 20 includes a sputtering gun for forming an inorganic thin film and a sputtering target 21 provided above the sputtering gun. As depicted in FIG. 1, the common sputtering unit 20 is provided at both upper sides within the vacuum chamber 50, and, thus, the sputtering unit 20 mounts the sputtering target 21 such that a surface of the sputtering target 21 is inclined toward a surface of the target object 31.

At the vacuum chamber 50, an inlet and an outlet for a processing gas are provided. Further, there is provided an organic source gas inlet (not illustrated) through which an organic source gas for forming an organic thin film on the target object 31 is introduced. A position of the organic source gas inlet (not illustrated) is not limited within the vacuum chamber 50, but desirably, it may be close to the target object 31.

The organic source gas for forming an organic thin film on the target object is formed in a gas in a vaporized state within a vaporization device (not illustrated) provided outside the vacuum chamber 50 and the organic source gas is introduced into the vacuum chamber 50 through the organic source gas inlet (not illustrated). The vacuum chamber 50 sustains a vacuum state while the processing gas is introduced and discharged and the organic source gas is introduced.

The sputtering process and the chemical vapor deposition process are performed by the above-described gas blocking layer forming apparatus 100. Through these processes, an organic thin film and an inorganic thin film can be formed on the target object 31.

That is, an inorganic thin film can be formed on the target object 31 by using the common sputtering unit 20 and the neutral particle generation unit 10 and an organic thin film can be formed on the target object 31 by depositing the organic source gas introduced into the vacuum chamber 50 through the chemical vapor deposition process.

A sequence of forming the organic thin film and the inorganic thin film on the target object 31 is not fixed. The organic thin film may be formed first on the target object 31 or the inorganic thin film may be formed first on the target object 31 depending on properties of the target object 31.

The organic thin film and the inorganic thin film may be stacked alternately on the target object 31 to be plural in number. The number of stacked films is not fixed but needs to satisfy a requirement for a high-performance gas blocking layer.

As depicted in FIG. 1, within the vacuum chamber 50, the plasma limiter 40 may be provided selectively. To be specific, as depicted in FIG. 1, the plasma limiter 40 is provided among the holding unit 30, the neutral particle generation unit 10, and the common sputtering unit 20 and the plasma limiter 40 generates a magnetic field in a horizontal direction in order for negative ions not to move toward the target object 31 by confining electrons in plasma.

The reason why the plasma limiter 40 generates a magnetic field in a horizontal direction during the sputtering process is to block high-energy negative ions that damage a thin film formed on the target object 31 and to acceleratedly pass positive ions for activation of the thin film.

The plasma limiter 40 includes magnets arranged according to a certain pattern to generate a magnetic field. An explanation thereof will be explained as below with reference to FIG. 2.

Figure 2:
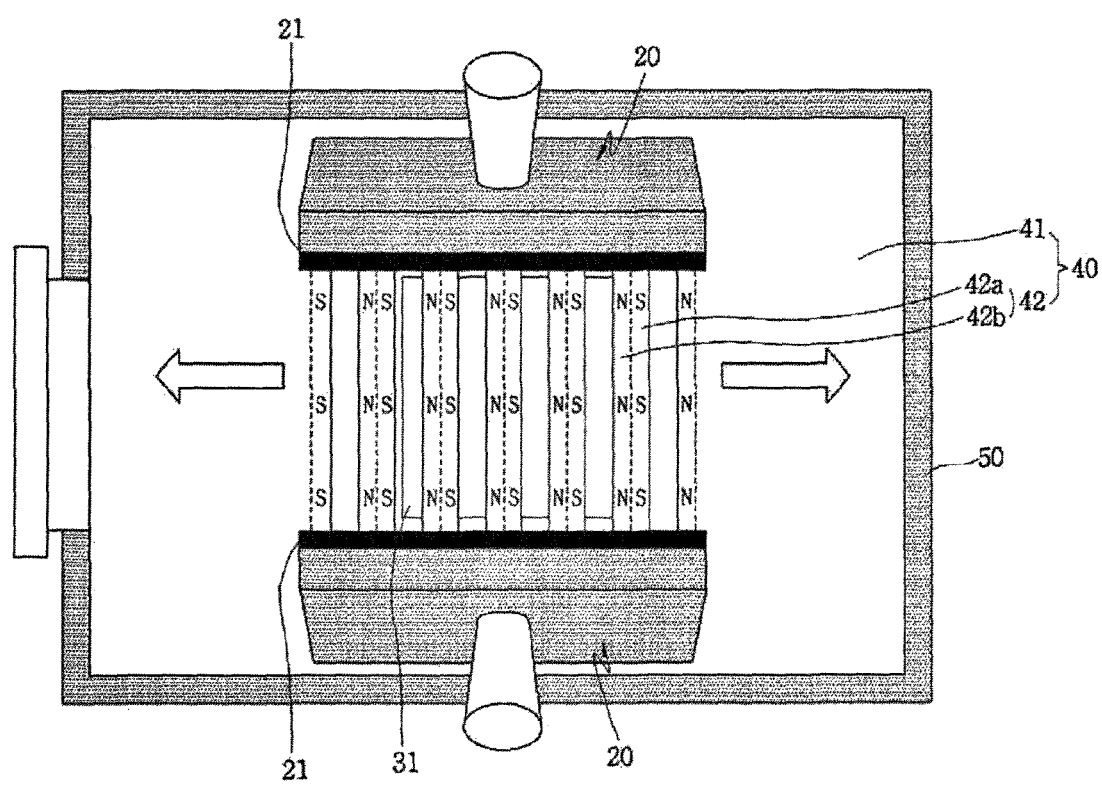
FIG. 2 is a plane view illustrating a schematic configuration of a plasma limiter applied to the present invention.

FIG. 2 is a plane view illustrating a configuration of the plasma limiter 40. As depicted in FIG. 2, the plasma limiter 40 includes a magnet array 42 and a fixing frame 41 that fixes the magnet array 42 and is fixed to an inside of the vacuum chamber 50.

The magnet array 42 constituting the plasma limiter 40 includes magnet pairs each comprised of a S-pole magnet 42a and a N-pole magnet 42b bonded to each other. The magnet pairs are spaced from each other so as to form a slit (a space between the magnet pairs).

To be specific, the S-pole magnet 42a and the N-pole magnet 42b are bonded to each other to form a magnet pair and magnet pairs are arranged so as to be spaced from each other. Thus, the magnet array 42 is formed. Since the magnet pairs are spaced away from each other, a slit can be formed therebetween. The magnet array 42 is fixed by the fixing frame 41. That is, the fixing frame 41 fixes the magnet array 42 and is fixed to the inside of the vacuum chamber 50.

In the magnet array 42, the magnet pairs each comprised of S-pole magnet 42a and a N-pole magnet 42b bonded to each other are spaced at a certain interval from each other. However, as depicted in FIG. 2, a N-pole magnet and a S-pole magnet are arranged respectively at both sides of the magnet array 42 instead of magnet pairs each comprised of a N-pole magnet and a S-pole magnet bonded to each other.

If the plasma limiter 40 is provided within the vacuum chamber 50, target materials sputtered from the sputtering target 21 are deposited on the target object 31 mounted on the holding unit 30 through slits formed at the plasma limiter 40.

Since the plasma limiter 40 includes the magnet array 42, the target materials cannot be uniformly deposited on the target object 31. Therefore, in accordance with the present invention, the target object 31 is provided so as to make a reciprocating movement, and, thus, a target material (an inorganic thin film) can be uniformly deposited on the target object 31. Even if the plasma limiter 40 is not used, a reciprocating movement can be made depending on a size and a use of the target object 31.

To be specific, the holding unit 30 that mounts the target object 31 is configured so as to make a reciprocating movement within the vacuum chamber 50. The reciprocating movement of the holding unit 30 can be made in combination with additional components (a motor, a rail, and the like).

FIG. 2 is a plane view illustrating a direction of the reciprocating movement of the holding unit 30. As depicted in FIG. 2, the reciprocating movement direction (a direction indicated by an arrow) of the holding unit 30 is perpendicular to a longitudinal axis of the slit (the space between the magnet pairs). If the holding unit 30 makes a reciprocating movement in such a direction, a thin film can be deposited on an upper area of the target object 31 where deposition cannot be made by obstruction of the magnet array 42, and, thus, a uniform thin film can be formed on the target object 31.

Desirably, the holding unit 30 may include a temperature control unit (not illustrated) capable of heating and cooling the target object 31 regardless whether or not the plasma limiter 40 is provided within the vacuum chamber 50.

The reason why the holding unit 30 includes the temperature control unit (not illustrated) is to efficiently deposit the organic source gas introduced into the vacuum chamber 50 on the target object 31. The temperature control unit (not illustrated) may be provided in the holding unit 30 such that the organic source gas is deposited only on the target object 31 but not deposited on inner walls of the vacuum chamber 50. Desirably, the holding unit 30 may also include a unit capable of heating or cooling the vacuum chamber 50.

Meanwhile, various substrates can be used as the target object 31 on which the organic thin film and the inorganic thin film are deposited. By way of example, the target object 31 may include a plastic substrate or a substrate on which a functional coating film is formed. Therefore, the organic thin film and the inorganic thin film can be formed to be plural in number on the plastic substrate or the substrate on which a functional coating film is formed, so that a gas blocking layer can be formed.

Further, the target object 31 may include a substrate on which an organic electronic device such as an organic light emitting device or an organic solar cell is formed. Therefore, the organic thin film and the inorganic thin film can be formed to be plural in number on the substrate on which an organic light emitting device or an organic solar cell is formed, so that a gas blocking layer can be formed The configuration of the gas blocking layer forming apparatus 100 can be summarized as follows.

The gas blocking layer forming apparatus 100 in accordance with the present invention includes the neutral particle generation unit 10, the common sputtering unit 20, and the holding unit 30 within the vacuum chamber 50. Within the vacuum chamber 50, the sputtering process is performed together with the chemical vapor deposition process.

Although not illustrated in FIG. 1, the neutral particle generation unit 10 includes the plasma source for generating a neutral particle beam. The conductive reflector 11 for generating a neutral particle beam is positioned above the neutral particle generation unit 10. The common sputtering unit 20 includes the sputtering gun for forming an inorganic gas blocking layer and the sputtering target 21.

However, the present invention is not limited to an inorganic thin film forming method using a common sputtering method and may include any other sputtering methods applicable to the present invention. If the gas blocking layer forming apparatus 100 in accordance with the present invention employs the common sputtering method, an angle of the sputtering gun and the sputtering target 21 at both sides can be changed in various ways.

At the lower side within the vacuum chamber 50, there is provided the holding unit 30 that supports the target object 31 on which an organic/inorganic mixed multilayer gas blocking layer is formed. The holding unit 30 may include the temperature control unit (not illustrated) capable of heating and cooling the target object 31. Further, the holding unit 30 may use the plasma limiter 40 if necessary, or may make a reciprocating movement so as to be applicable to a large-area process. A roll-to-roll substrate process may be performed thereto.

If the plasma limiter 40 is used, desirably, a substrate or a roll-to-roll substrate may make a reciprocating movement in a direction perpendicular to a longitudinal direction of the slit formed at the magnet array in order to prevent a thin film from being deposited non-uniformly due to the magnet array 42 of the plasma limiter 40 and a thickness of the plasma limiter 40. If the plasma limiter 40 is not used, the substrate may make a reciprocating movement in any direction with uniformity of a thin film.

A plasma gas for forming an organic thin film and an inorganic thin film may be positioned at any place within the vacuum chamber 50, but desirably, the plasma gas may be generated so as to be close to the neutral particle generation unit 10 and the common sputtering unit 20.

The organic source gas for forming an organic thin film may be supplied to any place within the vacuum chamber 50, but if the plasma limiter 40 is provided at an upper space of the holding unit 30, desirably, the organic source gas may be supplied to the upper space of the holding unit 30 or to the upper space of the plasma limiter 40.

Hereinafter, there will be explained a gas blocking layer forming method using the above-described gas blocking layer forming apparatus 100.

The gas blocking layer forming method in accordance with the present invention includes an organic/inorganic thin film forming process in which an inorganic thin film is formed on the target object 31 within the single vacuum chamber 50 and an organic thin film is formed thereon or an organic thin film is formed first and an inorganic thin film is formed thereon.

If the process is performed, the organic thin film and the inorganic thin film (or the inorganic thin film and the organic thin film) are stacked in sequence on the target object 31. That is, an organic/inorganic mixed thin film is formed on the target object 31.

After the organic/inorganic mixed thin film is formed on the target object 31, an organic/inorganic mixed multilayer thin film forming process is performed by repeatedly performing the organic/inorganic thin film forming process. As a result, the organic/inorganic mixed thin film is formed to be plural in number on the target object 31, so that a gas blocking layer is formed.

The organic/inorganic thin film forming process needs to be repeatedly performed such that the organic/inorganic mixed multilayer thin film can serve as a high-performance gas blocking layer. If the organic/inorganic mixed thin film or the organic thin film or the inorganic thin film can serve as a high-performance gas blocking layer, the organic/inorganic mixed multilayer thin film forming process can be omitted if necessary.

During the organic/inorganic mixed thin film forming process, an organic thin film may be formed first on the target object 31 or an inorganic thin film may be formed first on the target object 31. That is, the organic thin film may be formed first on the target object 31 or the inorganic thin film may be formed first on the target object 31 depending on properties of the target object 31.

Hereinafter, there will be explained an example where an organic/inorganic mixed thin film is formed by forming an organic thin film first on the target object 31 and an inorganic thin film on the formed organic thin film.

The organic thin film is formed by using a chemical vapor deposition method. To be more specific, a liquid polymer material is vaporized into a gas and supplied into the vacuum chamber 50 and then, an organic thin film is formed on the target object 31 by using plasma. Otherwise, a liquid polymer material is vaporized into a gas and supplied into the vacuum chamber 50 and then, an organic thin film is formed on the target object 31 by using a neutral particle beam. Still otherwise, a liquid polymer material is vaporized into a gas and supplied into the vacuum chamber 50 and then, an organic thin film is formed on the target object 31 by heating or cooling the target object 31.

A process for forming an organic thin film on the target object will be explained in more detail with reference to FIG. 3.

Figure 3:
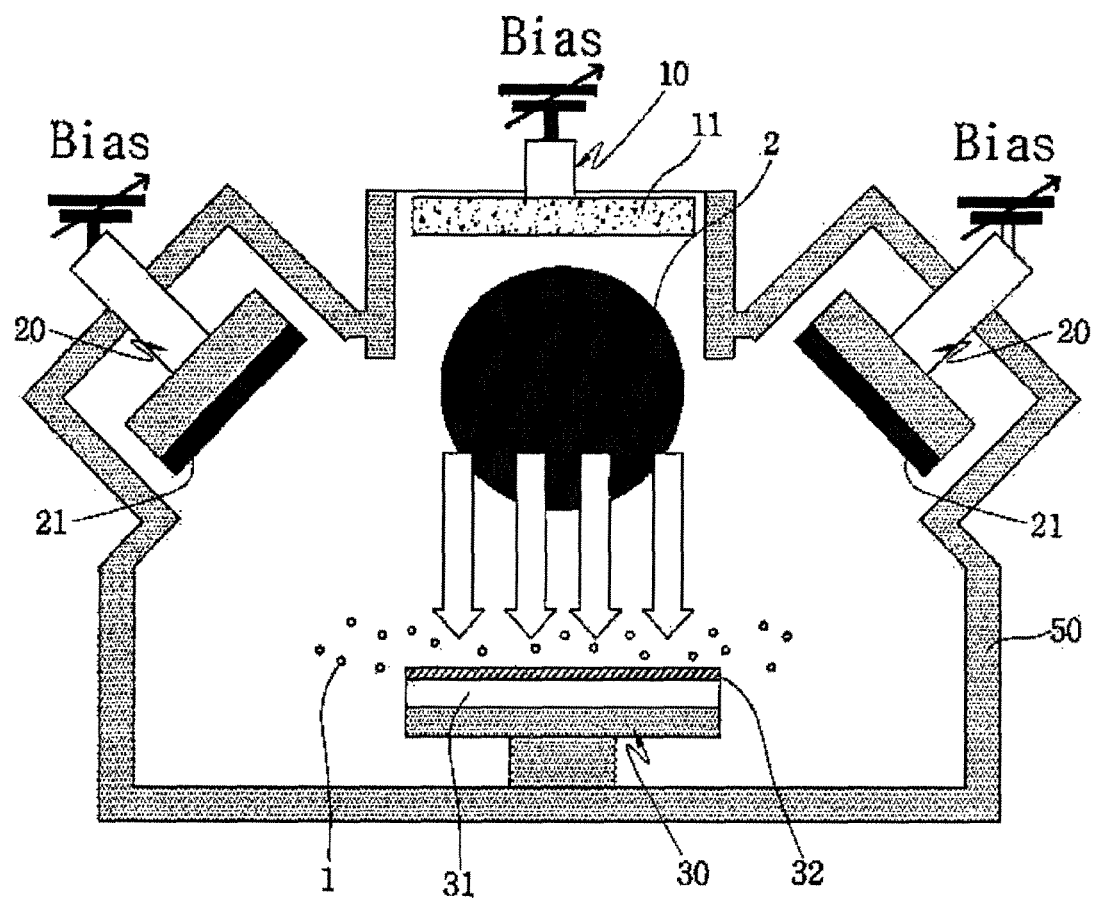
FIGS. 3 to 5 are process diagrams of a process for forming a gas blocking layer in accordance with an illustrative embodiment of the present invention.

Although not illustrated in FIG. 3, a vaporization device (not illustrated) capable of vaporizing a liquid organic polymer material for forming an organic thin film serving as a buffering organic layer on the target object is provided beside the vacuum chamber 50.

The liquid organic polymer material for forming an organic thin film is vaporized by using the vaporization device (not illustrated) and an organic source gas 1 in a gas state is supplied into the vacuum chamber 50. In this case, the organic source gas 1 may be supplied to any place within the vacuum chamber 50, but desirably, it may be supplied to an upper space of the holding unit 30 as depicted in FIG. 3.

In this case, within the vacuum chamber 50, a heating/cooling process may be performed in order to prevent the organic polymer material from being polymerized and deposited on other inner walls of the vacuum chamber 50 than the target object 31.

As described above, if the organic source gas 1 is supplied into the vacuum chamber 50, at the same time, a process gas for generating plasma is supplied into the vacuum chamber 50, specifically, to a space right below the neutral particle generation unit 10. Then, high-density plasma 2 is generated uniformly in the space right below the neutral particle generation unit 10 by using a separate plasma generation source.

A kind or method of the plasma source sued for generating the high-density plasma is not limited and may include various CCP (Capacitively Coupled Plasma) and ICP (Inductively Coupled Plasma) sources and various microwave plasma generation sources such as a SLAN (Slot Antenna) and a Lisitano antenna applicable to an illustrative embodiment of the present invention. It may be preferable to use a SLAN type microwave plasma generation source in which other structures are not provided in a plasma generation space and high-density plasma can be generated.

The organic source gas 1 is deposited on the target object 31 by using the generated high-density plasma 2 so as to form an organic thin film 32 serving as a buffering organic layer.

After the liquid polymer material is vaporized into a gas and supplied into the vacuum chamber 50, the organic thin film 32 can be formed by using a neutral particle beam in a different manner from a case where the organic source gas 1 is deposited on the target object 31 by using the high-density plasma 2.

To be specific, after the high-density plasma 2 is generated uniformly in the space right below the neutral particle generation unit 10, a predetermined negative bias voltage is applied to the conductive reflector 11 provided above the neutral particle generation unit 10, so that plasma ions in the high-density plasma 2 are accelerated toward a surface of the conductive reflector 11 and collide with the surface at the same time when a neutral particle beam having an energy equivalent to the bias voltage applied to the conductive reflector 11 and a high-density flux is generated by an Auger neutralization process.

Then, the target object 31 positioned within the vacuum chamber 50 is exposed to the neutral particle beam and the organic source gas 1 supplied into the vacuum chamber 50 is deposited selectively on the target object 31, so that the organic thin film 31 serving as a buffering organic layer can be formed.

The liquid polymer material can be vaporized into a gas and supplied into the vacuum chamber 50 and then the organic thin film 32 can be formed on the target object 31 by heating or cooling the target object 31 without the above-described high-density plasma generating process and (or) neutral particle beam generating process. The organic thin film 32 can be formed on the target object 31 by heating or cooling the target object 31 in addition to the above-described high-density plasma generating process and (or) neutral particle beam generating process.

After the organic thin film 32 serving as a buffering organic layer is formed on the target object 31 through the above-described processes, a process for forming an inorganic thin film on the organic thin film 32 is performed.

A process for forming an inorganic thin film on the target object 31 on which the organic thin film 32 is formed will be explained with reference to FIGS. 4 and 5.

The inorganic thin film is formed by using a sputtering method and a neutral particle beam processing method. The inorganic thin film is a single thin film but it is formed by stacking multiple nano-crystal structured layers having different crystal sizes and densities.

In this case, the inorganic thin film comprised of the nano-crystal structured layers includes multiple nano-crystal structured layers having different crystal sizes through a first process for forming a thin film having a nanoscale thickness on the organic thin film by a sputtering method, a second process for performing a neutral particle beam process to the thin film, and a third process for repeatedly performing the first process and the second process.

If necessary, the process including the first to third processes may be performed to obtain a target thickness of an inorganic thin film. If necessary, the process including the first to third processes may be performed to obtain a certain thickness of the inorganic thin film and then, only the first process may be performed to get the target thickness of the inorganic thin film.

The inorganic thin film comprised of the nano-crystal structured layers can be formed on the organic thin film by forming a thin film having a nanoscale thickness by a sputtering process and performing a neutral particle beam process with a neutral particle beam energy continuously controlled. That is, the inorganic thin film can be formed on the organic thin film by concurrently performing the sputtering process and the neutral particle beam process.

Even if the sputtering process and the neutral particle beam process are concurrently performed, when necessary, the sputtering process and the neutral particle beam process may be concurrently performed to obtain a certain thickness of an inorganic thin film and then, only the sputtering process may be performed to obtain a target thickness of the inorganic thin film, so that the inorganic thin film of multiple nano-crystal structured layers can be formed.

The above-described method for forming an inorganic thin film will be explained in more detail as follows.

Figure 4:
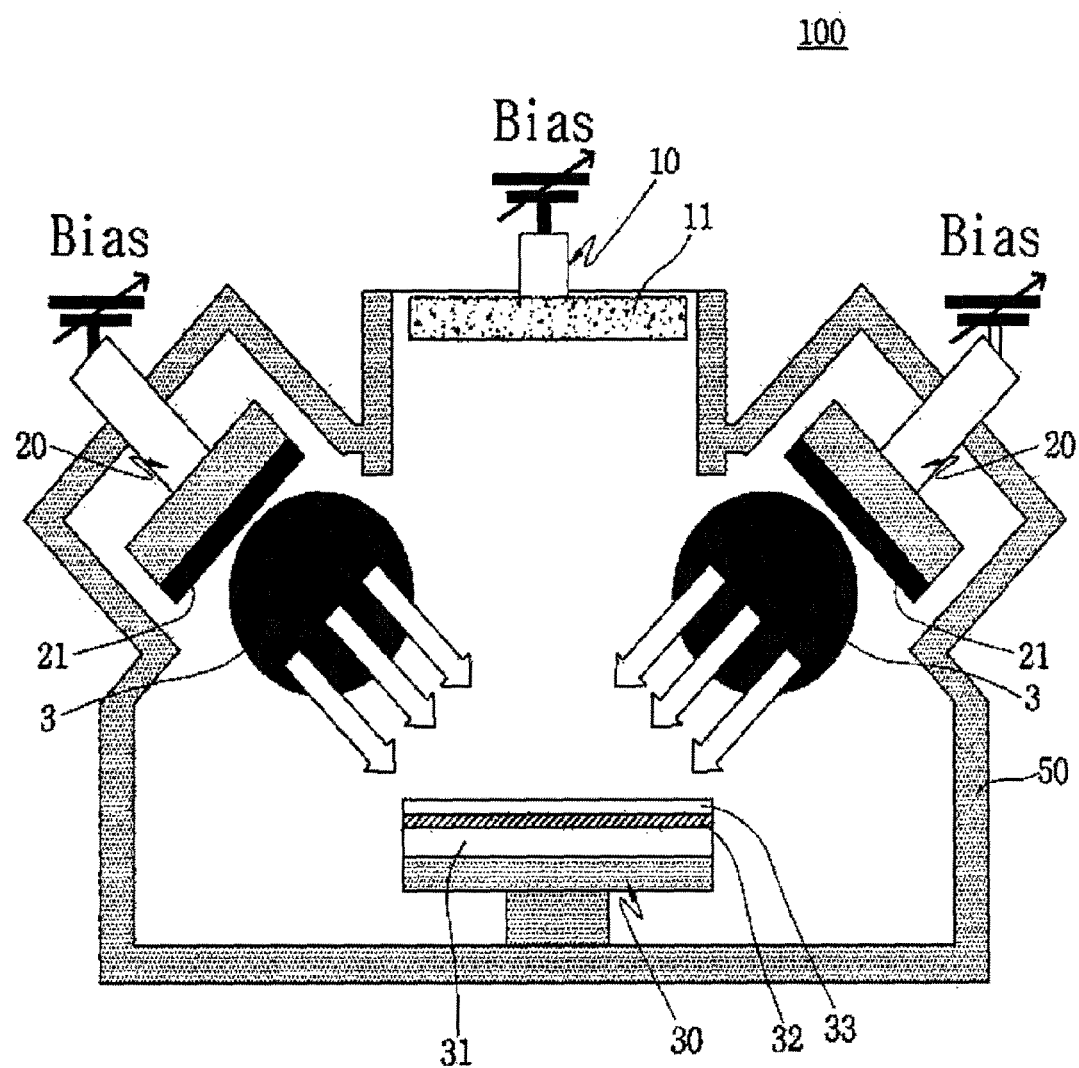

Referring to FIG. 4, a process gas as an inert gas such as Ar is supplied below the respective sputtering targets 21 of the common sputtering units 20 so as to form the organic thin film 32 serving as the buffering organic layer on the target object 31 and an inorganic thin film 33 serving as an inorganic gas blocking layer thereon.

Then, a predetermined negative bias voltage is applied to the sputtering targets 21 so as to generate plasma 3 and sputtered target elements are deposited on the organic thin film 32 formed on the target object 31 until an inorganic gas thin film having a target thickness is formed.

Figure 5:
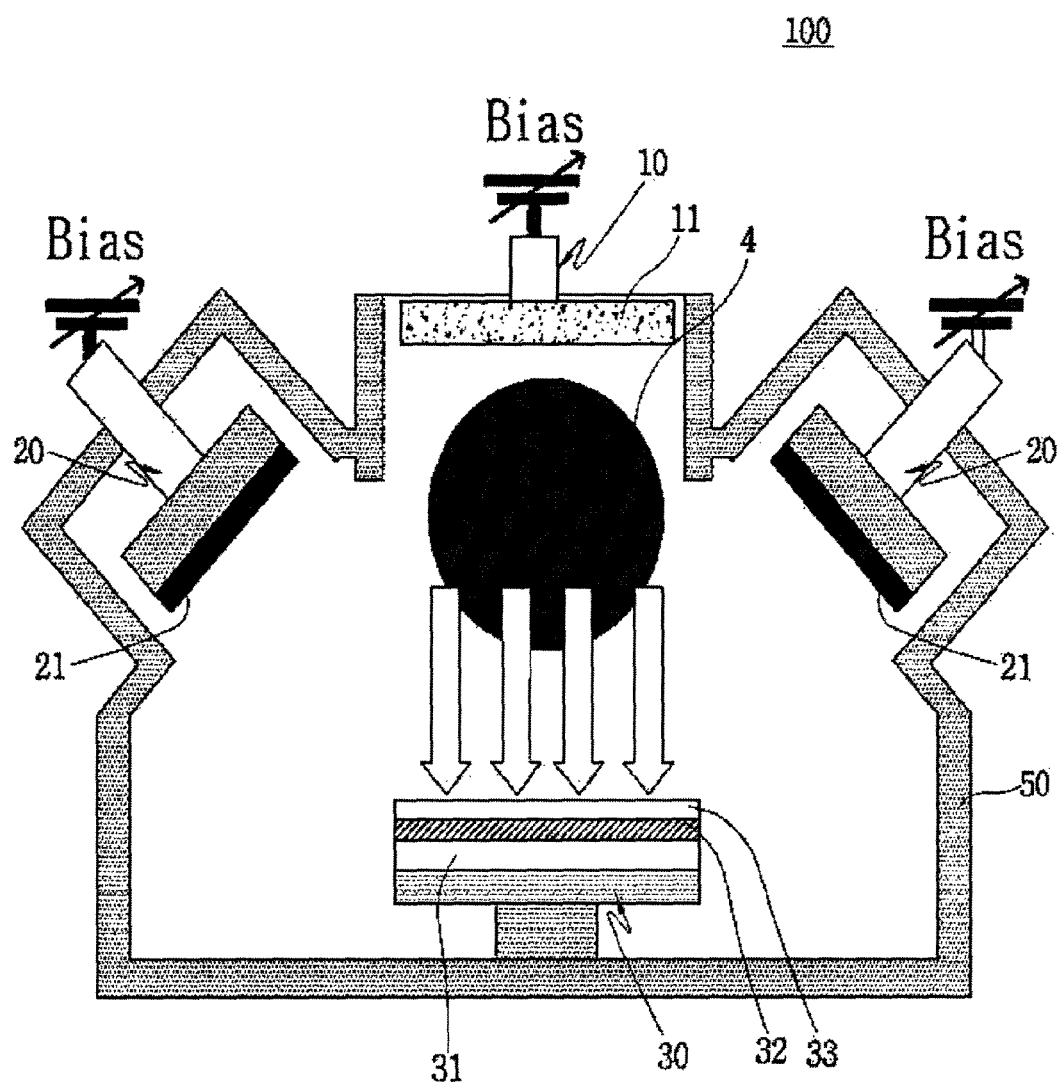

Thereafter, as depicted in FIG. 5, the process gas is supplied right below the neutral particle generation unit 10 so as to form high-density plasma 4, and a neutral particle beam having a high-density flux is generated. The inorganic gas thin film deposited on the organic thin film 32 is continuously processed with the neutral particle beam so as to form a high-density inorganic thin film 33 on the organic thin film 32.

In this case, the high-density inorganic thin film 33 may be formed by continuously controlling a size and a density of a nano-crystal structure of the inorganic thin film 33. The size of the nano-crystal structure may be controlled by controlling a predetermined bias voltage applied to the sputtering target 21, by controlling energy of the neutral particle beam by controlling a predetermined bias voltage applied to the conductive reflector 11 or by alterating conditions of the process like as an operating pressure.

In a process for forming the inorganic thin film 33 serving as the inorganic gas blocking layer, a sputtering process of an inorganic gas blocking layer is performed until the inorganic gas blocking layer is deposited to be an atomic layer of several nanometer thickness and then the sputtering process is stopped and the inorganic gas blocking layer of several nanometer thickness is processed with a neutral particle beam for a certain time by using the neutral particle generation unit 10, and the inorganic thin film can be formed by repeatedly performing the above-described processes (the sputtering process and the neutral particle beam process) until a target thickness of the inorganic thin film can be obtained.

Otherwise, in the process for forming the inorganic thin film 33 serving as the inorganic gas blocking layer, the sputtering process of the inorganic gas blocking layer is performed until the inorganic gas blocking layer is deposited to be an atomic layer of several nanometer thickness and then the sputtering process is stopped and the inorganic gas blocking layer of several nanometer thickness is processed with a neutral particle beam for a certain time by using the neutral particle generation unit 10, and only the sputtering process may be performed to obtain a target thickness of the inorganic thin film 33.

Still otherwise, the neutral particle beam process may be performed at the same time when the inorganic thin film 33 is formed by the sputtering process, so that the inorganic thin film 33 can be formed on the organic thin film 32.

In accordance with the above-described method, the organic/inorganic mixed thin film formed on the target object 31 can serve as a high-performance gas blocking layer. If the organic/inorganic mixed thin film needs to have more thin films stacked to improve a performance of the gas blocking layer, the above-described process needs to be performed repeatedly.

In the whole process for forming the organic/inorganic gas blocking layer, if the target object needs to be exposed not to plasma but to a neutral particle beam only, a process for preventing the target object 31 from being exposed to plasma may by selectively using the plasma limiter 40 may be included.

Figure 6:
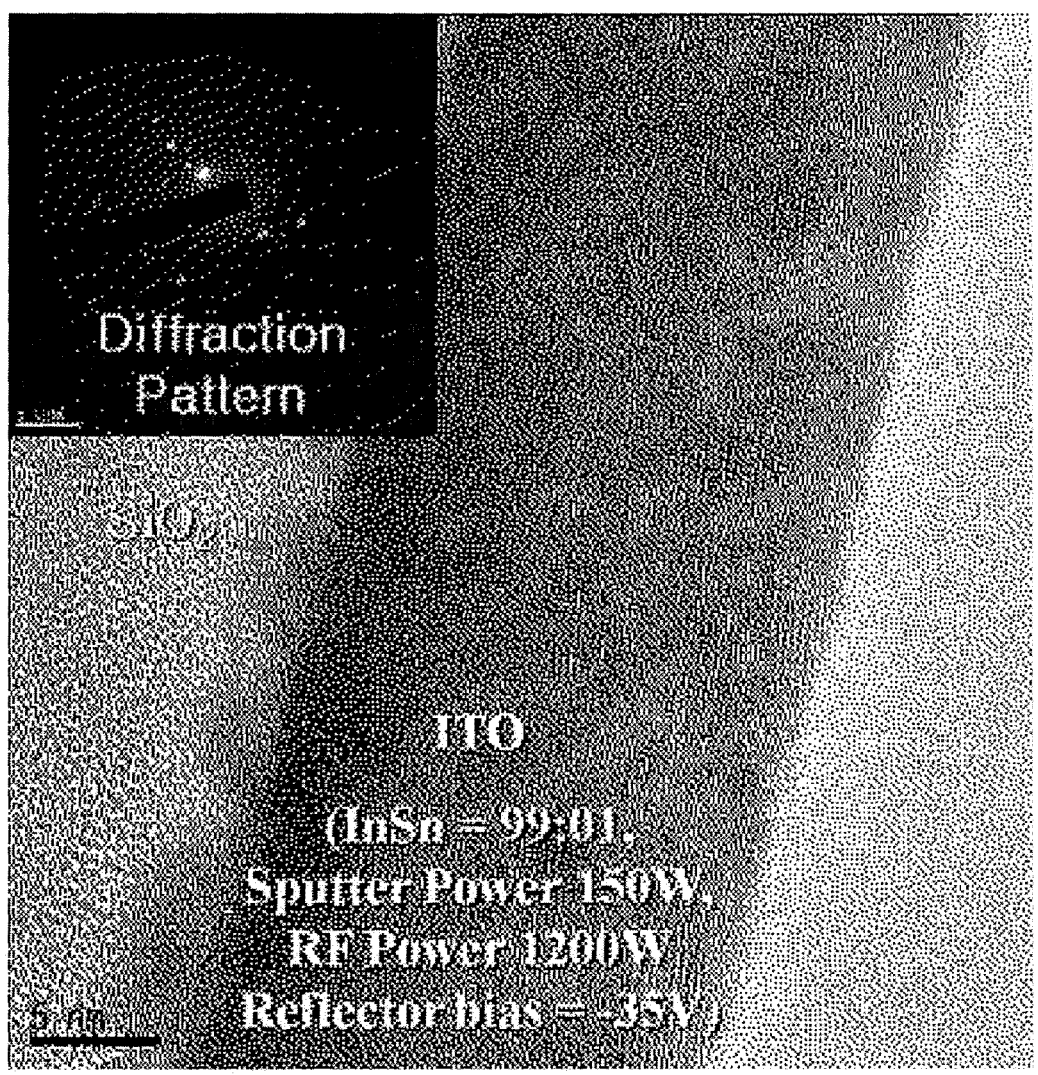
FIG. 6 is a photo showing a nano-crystal structure of an indium tin oxide thin film produced in accordance with an illustrative embodiment of the present invention.

FIG. 6 provides a TEM tomography image and an X-ray diffraction pattern of an indium tin oxide (ITO) thin film using the neutral particle beam process in accordance with the illustrative embodiment of the present invention. It can be seen that after the ITO thin film is sputtered and deposited to be equivalent to a mono layer of several nanometer thickness, the ITO thin film is processed with a neutral particle beam having a predetermined energy, and the ITO thin film has a nano-crystal structure through room temperature deposition. The same effect applies to most inorganic thin film materials preferred as an inorganic gas blocking layer. Accordingly, it is possible to form an inorganic gas blocking layer of high-performance/high-density nano-crystal structure.

Figure 7:
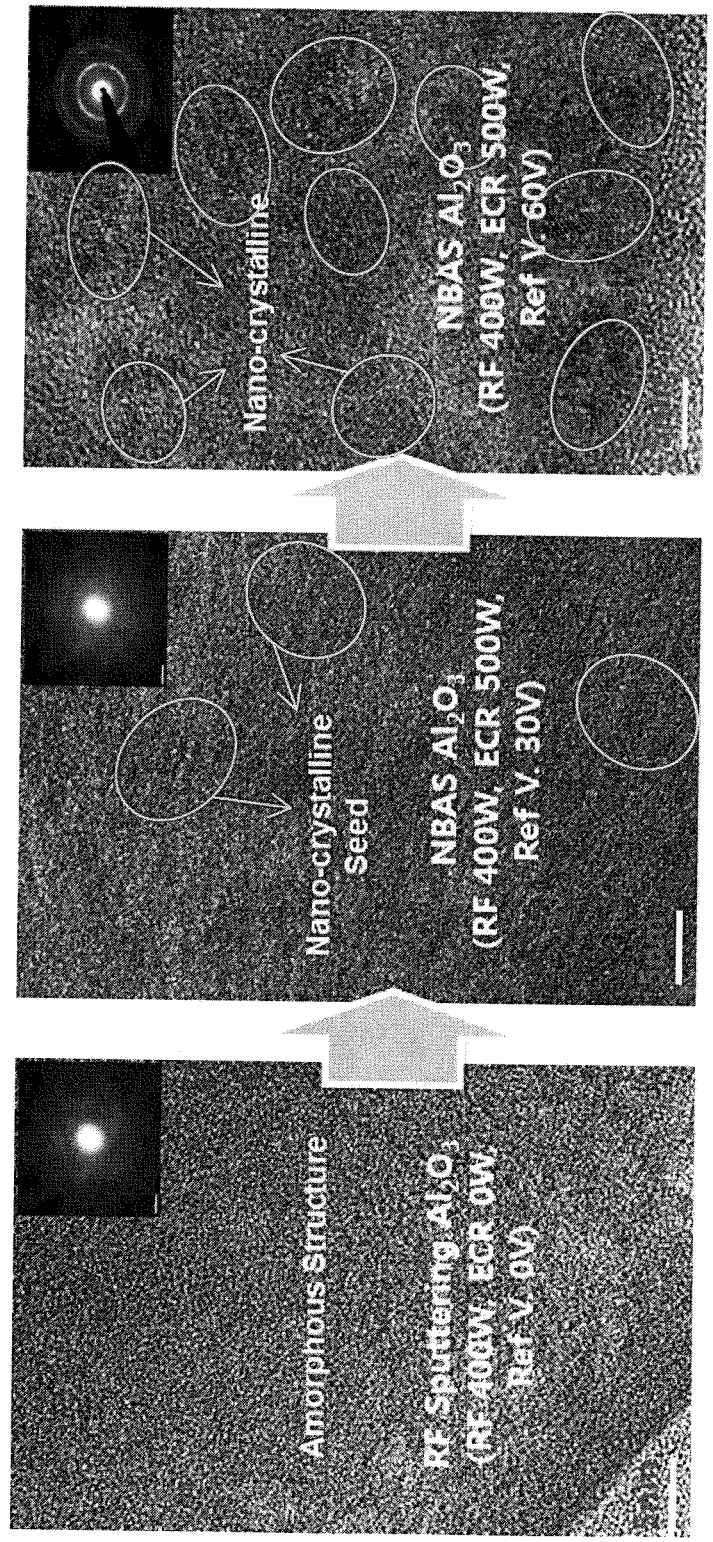
FIG. 7 is a photo showing that a size and a density of a nano-crystal structure of an aluminum oxide thin film produced in accordance with an illustrative embodiment of the present invention is changed depending on a neutral particle beam energy.

FIG. 7 provides a high-resolution TEM tomography image and an X-ray diffraction pattern of an aluminum oxide ($Al_2O_3$) thin film using the neutral particle beam process in accordance with the illustrative embodiment of the present invention. It can be seen that while the aluminum oxide thin film is sputtered and deposited to about 100 nanometer thickness, a neutral particle beam having a predetermined energy is irradiated to form the aluminum oxide thin film, and the aluminum oxide thin film has a nano-crystal structure through room temperature deposition. Further, it can be seen that when the energy of the neutral particle beam is appropriately increased by increasing a predetermined bias voltage applied to the conductive reflector 11, a size and a density of the nano-crystal structure is increased. Accordingly, it can be seen that a size and a density of a nano-crystal structure uniformly formed within a metal oxide, a metal nitride, a silicon oxide or a silicon nitride by controlling the energy of the neutral particle can be easily controlled, and, thus, it is possible to form an inorganic gas blocking layer of high-performance/high-density nano-crystal structure.

Figure 8:
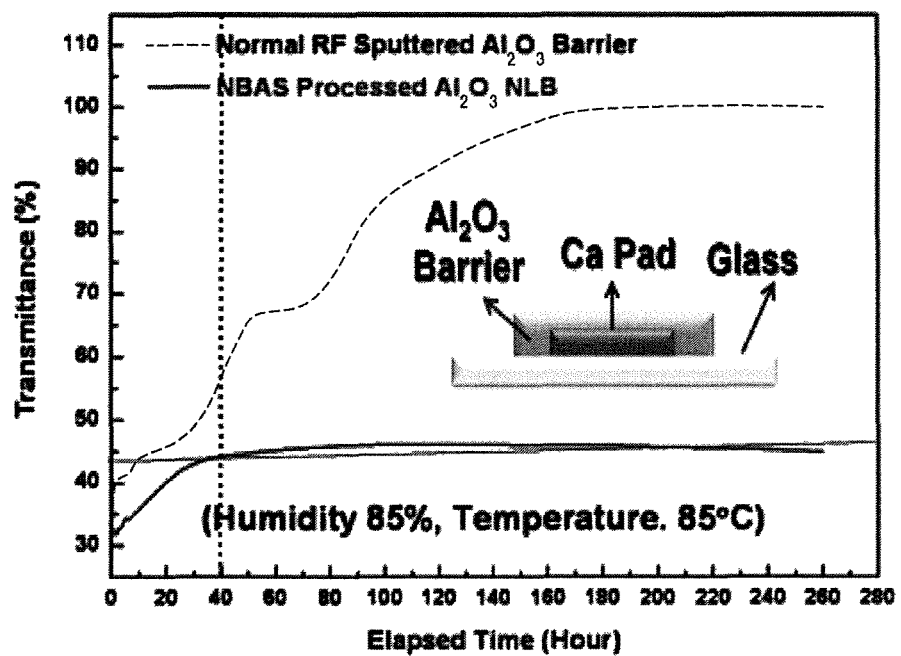
FIG. 8 is a graph showing a result of an accelerated test of a calcium pad employing an aluminum oxide thin film produced in accordance with an illustrative embodiment of the present invention as a sealing member.

FIG. 8 is a graph showing a result of an accelerated test (at a temperature of about 100° C. and a humidity of about 85%) of calcium (Ca) pads employing aluminum oxide thin films of about 100 nm thickness produced by a sputtering process using the neutral particle beam in accordance with the illustrative embodiment of the present invention and a typical sputtering process, respectively, as a sealing member. When the aluminum oxide thin film produced by the sputtering process using the neutral particle beam is used as a sealing member, there is no change in transmittance of the calcium pad after about 260 hours and a water vapor transmission rate (WVTR) of about $5 \times 10^{-6}$ $g/m^2/day$ at room temperature can be obtained according to the conversion formula given in the document [R. Paetzold, et al., Review of Sci. Instrum. 74, 5147 (2003)].

What is claimed is:

1. A gas blocking layer forming apparatus comprising:
   a vacuum chamber that provides a space where a chemical vapor deposition process and a sputtering process are performed;
   a holding unit that is provided at a lower side within the vacuum chamber and mounts thereon a target object on which an organic/inorganic mixed multilayer gas blocking layer is formed;
   a neutral particle generation unit that is provided at an upper side within the vacuum chamber and includes a flat conductive reflector for generating a neutral particle beam and a plasma source for generating plasma ions below the conductive reflector; and
   common sputtering devices that are provided at both sides of the neutral particle generation unit to deposit target materials directly to the target object,
   wherein a surface of a sputtering target included in each of the common sputtering devices is inclined toward a surface of the target object,
   a predetermined negative bias voltage is applied to the conductive reflector,
   the plasma ions are vertically introduced into the conductive reflector and collide with the conductive reflector, so that the plasma ions are converted into neutral particles,
   the neutral particles are supplied to the gas blocking layer formed on the target object, and
   the gas blocking layer contains at least one of an inorganic thin film which is formed on the target object by depositing the target materials sputtered from the sputtering target of the common sputtering devices and the neutral particle beam generated by the neutral particle generation unit, and at least one of an organic thin film which is formed on the target object by depositing an organic source gas introduced into the vacuum chamber through the chemical vapor deposition process.

2. The apparatus of claim 1, further comprising:
   a plasma limiter that is provided among the holding unit, the neutral particle generation unit, and the common sputtering unit and generates a magnetic field in a horizontal direction in order for negative ions not to move toward the target object by confining electrons in plasma.

3. The apparatus of claim 2,
   wherein the plasma limiter comprises:
   a magnet array that includes magnet pairs each comprised of a N-pole magnet and a S-pole magnet bonded to each other; and
   a fixed frame that fixes the magnet array and is fixed to an inside of the vacuum chamber, wherein the magnet pairs are spaced from each other so as to form a slit.

4. The apparatus of claim 3,
   wherein the holding unit is configured to make a straight reciprocating movement in a direction within the vacuum chamber, and
   a direction of the reciprocating movement of the holding unit is perpendicular to a longitudinal axis of the slit.

5. The apparatus of claim 1,
   wherein the holding unit comprises a temperature control unit that heats and cools the target object.

6. The apparatus of claim 1,
   wherein the target object includes a substrate on which an organic light emitting device or an organic solar cell is formed.

7. A gas blocking layer forming method comprising:
   forming a first thin film on a target object within a vacuum chamber; and
   forming a second thin film on the first thin film within the vacuum chamber, wherein the first thin film is an inorganic thin film and the second thin film is an organic thin film, or the first thin film is an organic thin film and the second thin film is an inorganic thin film, the organic thin film is formed by depositing an organic source gas introduced into the vacuum chamber through a chemical vapor deposition process and the inorganic thin film is formed by depositing target materials sputtered from a sputtering target of common sputtering devices and a neutral particle beam generated by a neutral particle generation unit, the neutral particle generation unit is provided at an upper side within the vacuum chamber, the common sputtering devices are provided at both sides of the neutral particle generation unit to deposit the target materials directly to the target object, and a surface of the sputtering target included in each of common sputtering devices is inclined toward a surface of the target object.

8. The method of claim 7, wherein the organic thin film is formed by using plasma after a liquid polymer material is vaporized into a gas and supplied to the vacuum chamber or by using the neutral particle beam after a liquid polymer material is vaporized into a gas and supplied to the vacuum chamber or by heating or cooling the target object after a liquid polymer material is vaporized into a gas and supplied to the vacuum chamber.

9. The method of claim 7, wherein the inorganic thin film is formed by stacking nano-crystal structured layers having different crystal sizes.

10. The method of claim 9, wherein the nano-crystal structured layers are formed through a first process for forming a thin film having a nanoscale thickness by a sputtering method, a second process for performing a neutral particle beam process to the thin film, and a third process for repeatedly performing the first process and the second process.

11. The method of claim 10, wherein after the third process, the first process is further performed to obtain a target thickness of the inorganic thin film.

12. The method of claim 9, wherein the nano-crystal structured layers are formed by performing the neutral particle beam process and, at the same time, forming the inorganic thin film by the sputtering method.

* * * * *